United States Patent [19]
Schmutz

[11] Patent Number: 5,424,533
[45] Date of Patent: Jun. 13, 1995

[54] SELF ILLUMINATING TOUCH ACTIVATED OPTICAL SWITCH

[75] Inventor: Lawrence E. Schmutz, Watertown, Mass.

[73] Assignee: United Technologies Corporation, Hartford, Conn.

[21] Appl. No.: 263,224

[22] Filed: Jun. 21, 1994

[51] Int. Cl.⁶ .................. G01V 9/04; G06M 7/00; H01J 40/14
[52] U.S. Cl. .................. 250/221; 250/229; 341/31
[58] Field of Search .......... 250/221, 229; 341/31

[56] References Cited

U.S. PATENT DOCUMENTS

| | | | |
|---|---|---|---|
| 3,886,544 | 5/1975 | Narodny | 340/365 P |
| 4,254,333 | 3/1981 | Bergstrom | 250/221 |
| 4,340,813 | 7/1982 | Sauer | 250/221 |
| 4,814,600 | 3/1989 | Bergstrom | 250/221 |
| 4,980,547 | 12/1990 | Griffin | 250/221 |
| 5,220,409 | 6/1993 | Bures | 356/375 |
| 5,270,859 | 12/1993 | Wirth et al. | 359/622 |

FOREIGN PATENT DOCUMENTS 636803 7/1978 U.S.S.R. .

OTHER PUBLICATIONS

"Fiber Optic Illuminated Switch", E. C. Uberbacher, IBM Technical Disclosure Bulletin, vol. 18, No. 2, Jul. 1975, p. 483.

"Fibre-optic Panel Switches With Self Illuminated Display Part 1", A. L. Harmer and J. P. Frauche, Electronic Engineering, Apr. 1981, pp. 51–55.

"Fibre-optic Panel Switches With Self Illumionated Display Part 2", A. L. Harmer and J. P. Frauche, Electronic Engineering, Jun. 1981.

*Primary Examiner*—David C. Nelms
*Assistant Examiner*—Stephen Calogero
*Attorney, Agent, or Firm*—Ozer M. N. Teitelbaum

[57] ABSTRACT

The present invention teaches a touch activated switch. The switch comprises a light source for generating a light ray. Further, the switch comprises a first lens for collimating the light source's light ray. The first lens, as a result, generates a collimated light ray in a first direction. In a second direction, the first lens forms a first and a second focal point, such that the light source is positioned at the first focal point. Moreover, the switch comprises a second lens for converging the collimated light ray to a surface. This surface scatters the collimated light ray in the direction of the first lens when the surface is substantially touched. The switch also comprises a detector for detecting the collimated light ray which have been scattered by touching the surface, with the detector being positioned at the second focal point, such that the switch is activated in response to touching the surface.

23 Claims, 3 Drawing Sheets

SELF ILLUMINATING TOUCH ACTIVATED OPTICAL SWITCH

TECHNICAL FIELD

This invention relates to the field of optical devices, and more particularly to a self illuminating, touch activated optical switch.

BACKGROUND ART

In the field of optical switches, several designs are known in the art. These switches can be categorized into two separate classes.

The first class of optical switches relies on reflected radiation within the switch. These devices, such as those proposed by Sauer in U.S. Pat. No. 4,340,813, and Uberbacher in the IBM Technical Disclosure Bulletin of July 1975, Volume 18, No. 2, page 483, are dependent on the physical motion of a component, such as a surface membrane, to alter the optical path within the component. By so doing, the switching characteristics are effected.

These designs have several known shortcomings. First, while they are immune to external optical radiation, the area of actuation or touch/sense point is extremely limited. Further, these approaches require constraints on manufacturing tolerances. Moreover, these designs do not provide an extension to proximity sensing. Finally, they fail to provide an option of the actuation surface and the switch mechanism.

The second class of optical switches, such as those proposed by Bergström in U.S. Pat. Nos. 4,254,333 and 4,814,600, as well as Udalov et al. Soviet Union Patent Number 636,803, depend on the frustration of total internal reflection ("FTIR"). These devices require physical contact with a reflecting surface to interrupt the internal reflection of an optical light beam.

As with the first class of switches, FTIR switches have several inherent limitations. First, FTIR devices are sensitive to external light sources, such as ambient light, as well as dirt, oil films, water and other contaminants. These materials form on an actuation surface of an FTIR switch, thereby reducing switching threshold and causing false actuations. Moreover, the switching reliability of FTIR devices is known to be sensitive to nature quality of the contacting object. Thus, a gloved finger may not respond as an ungloved finger might. Furthermore, these devices have tight manufacturing tolerances. FTIR type switches have areas of restricted actuation. Similarly, these devices lack a simple method for separating the actuation plane from the switch mechanism or a method for extending the switch to proximity sensing.

As such, there remains a need for an optical switch having substantial immunity to external optical radiation and contaminants impacting the actuation surfaces. A demand further exists for an optical switch which can be enabled irrespective of the quality and nature of the contacting object. An optical switch is moreover needed having substantially reduced manufacturing tolerances. Likewise, a demands exists for an optical switch having extended proximity sensing. Furthermore, a need exists for an optical switch having a substantially increased area of actuation. There is also presently a demand for an optical switch having the capability of separating the actuating surface from the switch mechanism. Likewise, there is a demand for the actuating surface to be backlit for visibility and actuation indication.

DISCLOSURE OF THE INVENTION

The primary advantage of the present invention is to provide a touch activated optical switch having substantial immunity to external optical radiation, including ambient light, and contaminants impacting its actuation surface.

A further advantage of the present invention is to provide a touch activated optical switch which can be activated regardless of the quality and nature of the contacting object.

Another advantage of the present invention is to provide a touch activated optical switch having improved reliability, requiring no moving parts.

Still another advantage of the present invention is to provide a touch activated switch requiring a simplified manufacturing process, having substantially reduced manufacturing tolerances.

Yet another advantage of the present invention is to provide a self illuminating, touch activated switch having increased immunity to false triggers.

Yet a further advantage of the present invention is to provide a self illuminating, touch activated switch having a substantially increased areas of actuation, and extended proximity sensing.

Yet still another advantage of the present invention is to provide a self illuminating, touch activated switch capable of separating the actuating surface from the switch mechanism.

In order to achieve the advantages of the present invention, a touch activated switch is disclosed. The switch comprises a light source for generating a light ray. Further, the switch comprises a first lens system for collimating the light source's light ray. The first lens system, as a result, generates a collimated light ray in a first direction. In a second direction, the first lens system forms a first and a second focal point, such that the light source is positioned at the first focal point. Moreover, the switch comprises a second lens system for converging the collimated light ray to a surface. This surface scatters the collimated light ray in the direction of the first lens system when the surface is substantially touched. The switch also comprises a detector for detecting the collimated light ray which have been scattered by touching the surface, with the detector being positioned at the second focal point, such that the switch is activated in response to touching the surface.

BRIEF DESCRIPTION OF THE DRAWINGS

The present invention will be better understood from reading the following description of non-limited embodiments, with reference to the attached drawings, wherein below.

DETAILED DESCRIPTION OF THE INVENTION

Figure 1:
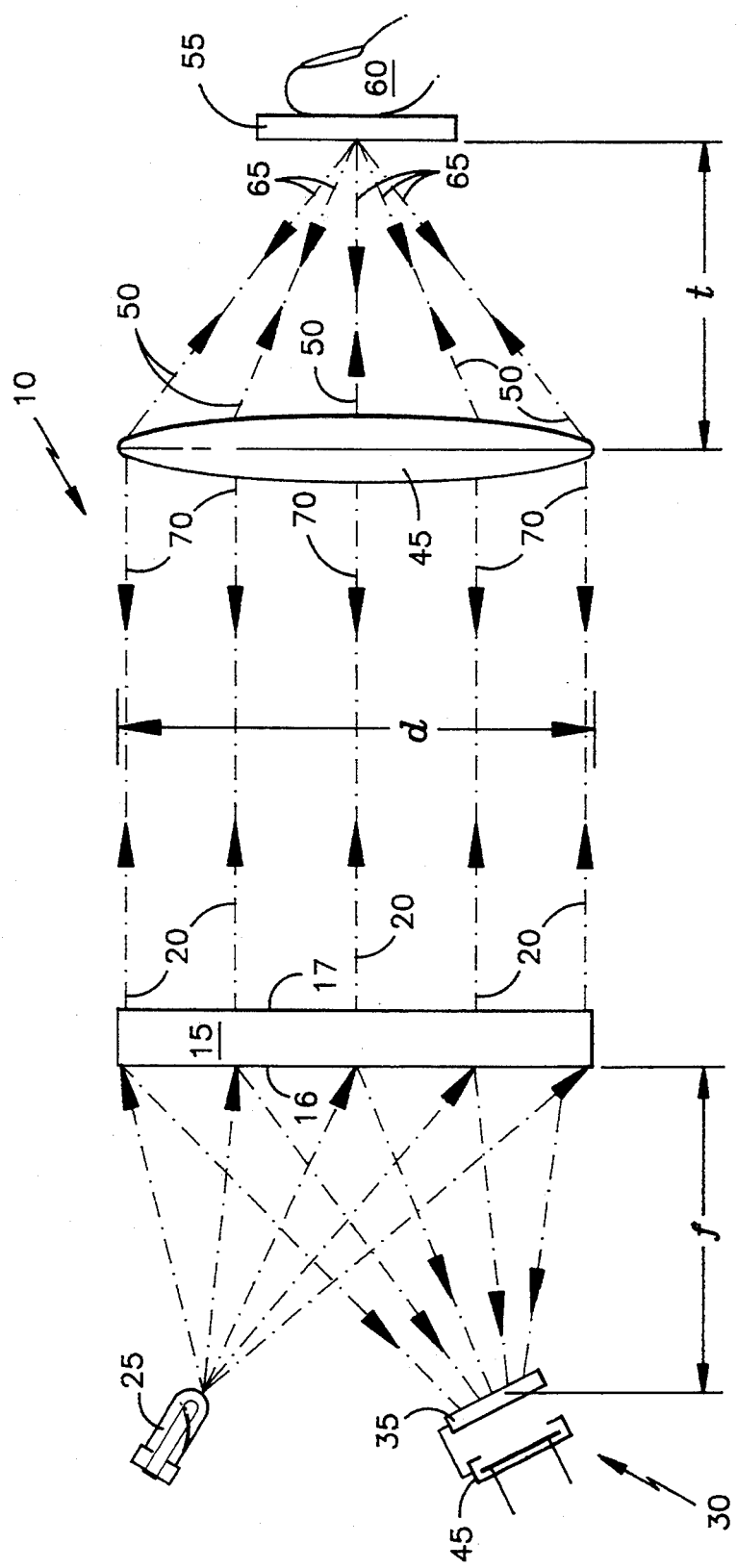
FIG. 1 illustrates a first embodiment of the present invention.

Referring to FIG. 1, a self illuminating touch activated switch 10 is illustrated according to a first embodiment of the present invention. It should become apparent to one of ordinary skill in the art upon reading the instant disclosure that the novel and inventive touch activated switch of the present invention relies on the principles of partial reflection to enable or disable switch 10.

To this end, switch 10 comprises a light source 25, which is preferably a light emitting diode. Light source 25 emits light in a first direction. Given the nature of its source, the light generated is uniformly directed at a lens arrangement 15. As a result, a first face 16 of arrangement 15 receives these light emissions.

Upon its reception, the light generated by light source 25 in the noted first direction is collimated by lens arrangement 15, to produces collimated light 20. Collimated light 20 comprises light emissions traveling in the first direction and having equal intensity.

Lens arrangement 15 exhibits additional optical characteristics. When light in a second direction is directed at arrangement 15 and its second face 17, two focal points are formed. Light source 25 is positioned at the first focal point having a distance f from lens arrangement 15. In that same light, at the second focal point is positioned a light detector assembly 30 having a distance f from lens arrangement 15. Distance f refers to the focal length between lens arrangement 15 and the focal plane associated with both first and second focal points. Lens arrangement 15 also comprises a diameter d.

Switch 10 further comprises a second lens arrangement 45. Collimated light 20, traveling in the first direction, illuminates second lens arrangement 45. Lens arrangement 45 functionally converges collimated light 20 to a convergent light beam 50 at a sense point at a distance t from second lens arrangement 45. Positioned at the sense point is a transparent surface 55.

Surface 55 and the sense point directly relate to enabling/disabling switch 10. Without external stimuli, transparent surface 55 is illuminated by convergent light beam 50. However, by positioning an object or finger 60 at the sense point of surface 55, the state of switch 10 may thereby be changed.

The state change of the switch 10 relies on the principles of confocal illumination and reflection, as well as light intensity modulation. Light intensity, with respect to focal length, can be mathematically represented by the following formula, hereinafter referred to as equation 1:

$$I = a * \{[\sin(z')/z']^4\}$$

wherein I represents light intensity, $a$ represents a quantifiable constant, and $z'$ is proportional to the location of an object relative to surface 55. It should be apparent to one of ordinary skill in the art that given this mathematical relationship, an object or finger touching surface 55 at the sense point, which is distanced from second lens arrangement 45 by the arrangement's focal length, modulates the light intensity.

Upon touching the sense point of surface 55, convergent light beam 50 is scattered. This results in scattered light emissions 65. Given the reciprocity of second lens arrangement 45, these scattered light emissions 65, traveling in the previously referred to second direction, are recollimated to form recollimated light emissions 70. Recollimated light emissions are then transmitted in the second direction to first lens arrangement 15.

As described hereinabove, first lens arrangement 15 produces a first and a second focal point when light is directed in the second direction. Thus, by positioning detector assembly 30 at the second focal point, a change of the state of switch 10 can be realized by the detection of the light emissions generated by the first lens arrangement. These first lens arrangement's light emissions are the result of recollimated light emissions transformed by the scattering of converging light 50 through the touching of surface 55 with a finger 60.

Detector assembly 30 essentially comprises a light detector 40 and a filtering means 35. Light source detector 40 preferably comprises a silicon diode detector. Filtering means 35 is incorporated for the purpose of reducing the false triggers of switch 10 associated with the touching of surface 55. The filtering means 35 also increases the immunity of switch 10 to the effects of ambient light passing through transparent surface 55. This filtering means 35 can be realized by a notch filter which selectively enables a spectral band of energy emitted from the light source to be transmitted into light detector 40.

In a similar scheme, this filtering means 35 can be realized by employing a light source 25 which emits light energy having confined wavelength range, or color. Furthermore, a sensitive detector is also employed having the identical confined wavelength range, or color, to discern scattered light from ambient light.

It should be noted that first and second lens arrangement 15 and 45 can be realized by several means. One means available is a micro-optic multiplet ("MOM") lenslet, also referred to as monolithic lenslet module ("MLM"), as disclosed in U.S. Pat. No. 5,270,859, commonly assigned with the present invention and hereby incorporated by reference. Using a MOM, both lens arrangements 15 and 45 could be formed on a single substrate to provide simplified manufacturing.

Figure 2:
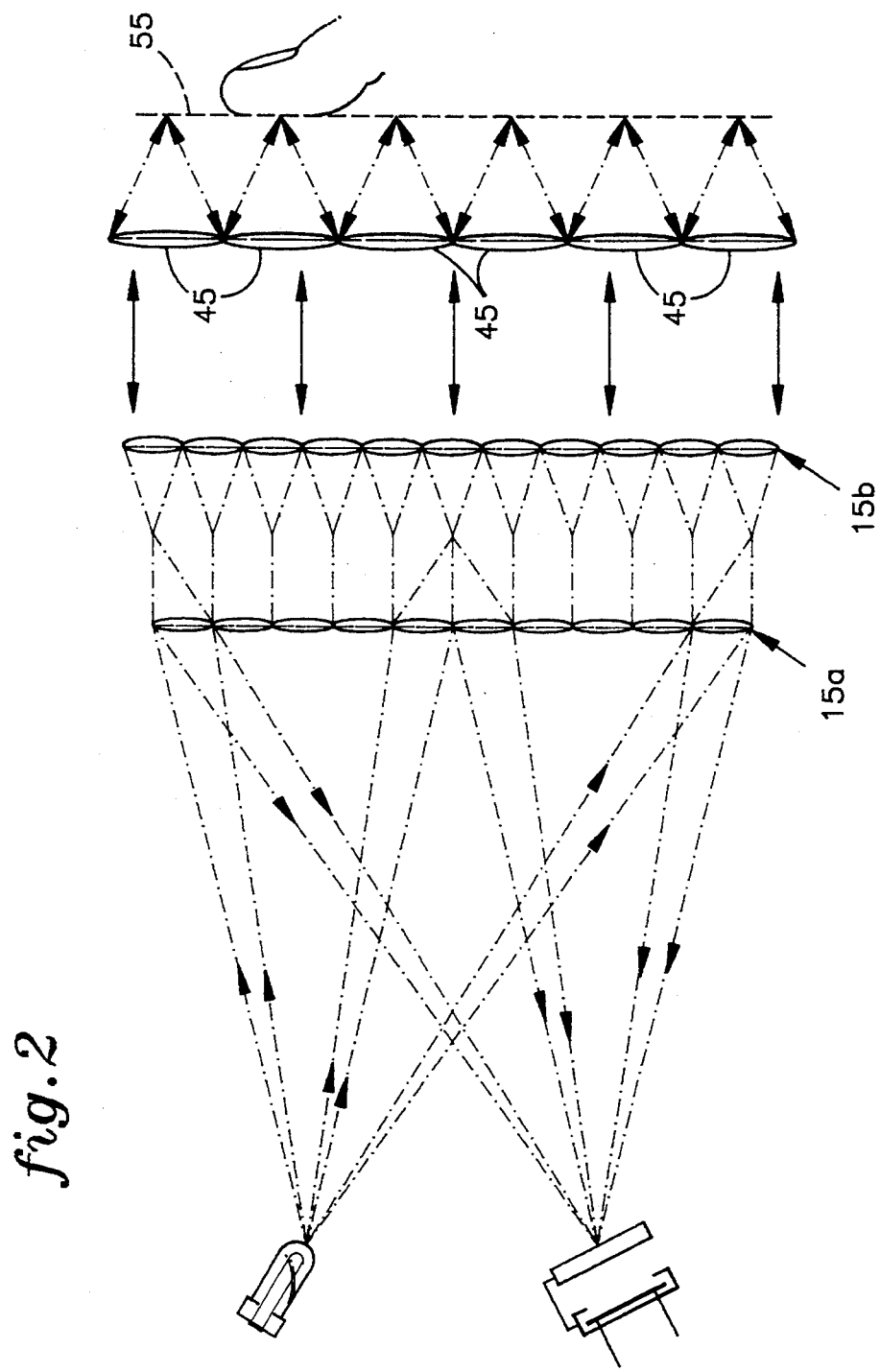
FIG. 2 illustrates the preferred embodiment of the present invention.

Referring to FIG. 2, the preferred embodiment is illustrated. Here, first lens arrangement is shown having a first and second MOM, 15a and 15b. Both MOMs, 15a and 15b, comprise an array of lenses which are shifted out of phase relative to one another, such that the focal points of each lens of the array of lenses of the first MOM 15a are aligned with the intermediary between two adjacent lenses of the array of the second MOM 15b. By this configuration, collimated light is transmitted in both the first and second direction.

FIG. 2 also depicts second lens arrangement 45 as an array of lenses shifted out of phase relative to the second array of lenses 15b of the first lens arrangement. By so doing, a multiple number of sense points for the same switch are created along the same surface 55. Also of note is the difference in diameters between the arrays of lenses of the first lens arrangement and the array of lenses of the second lens arrangement.

In another embodiment of the present invention, at least one of the first and second lens arrangements 15 and 45 comprise a Holographic Optical Element ("HOE"). As is known to one skilled in the art, a HOE can be realized by causing a source illumination to be placed in the position optically conjugate to source 25, a holographic master such as, for example, a photographic plate to be placed in the position optically conjugate to the lens assembly 15, and a reference illumination optically conjugate to the detector 40. From this configuration, a HOE may be fabricated having desired performance characteristics. Nonetheless, limitations exist with regards to the choice of the wavelength of source 25, and the choice of self illumination wavelengths.

Figure 3:
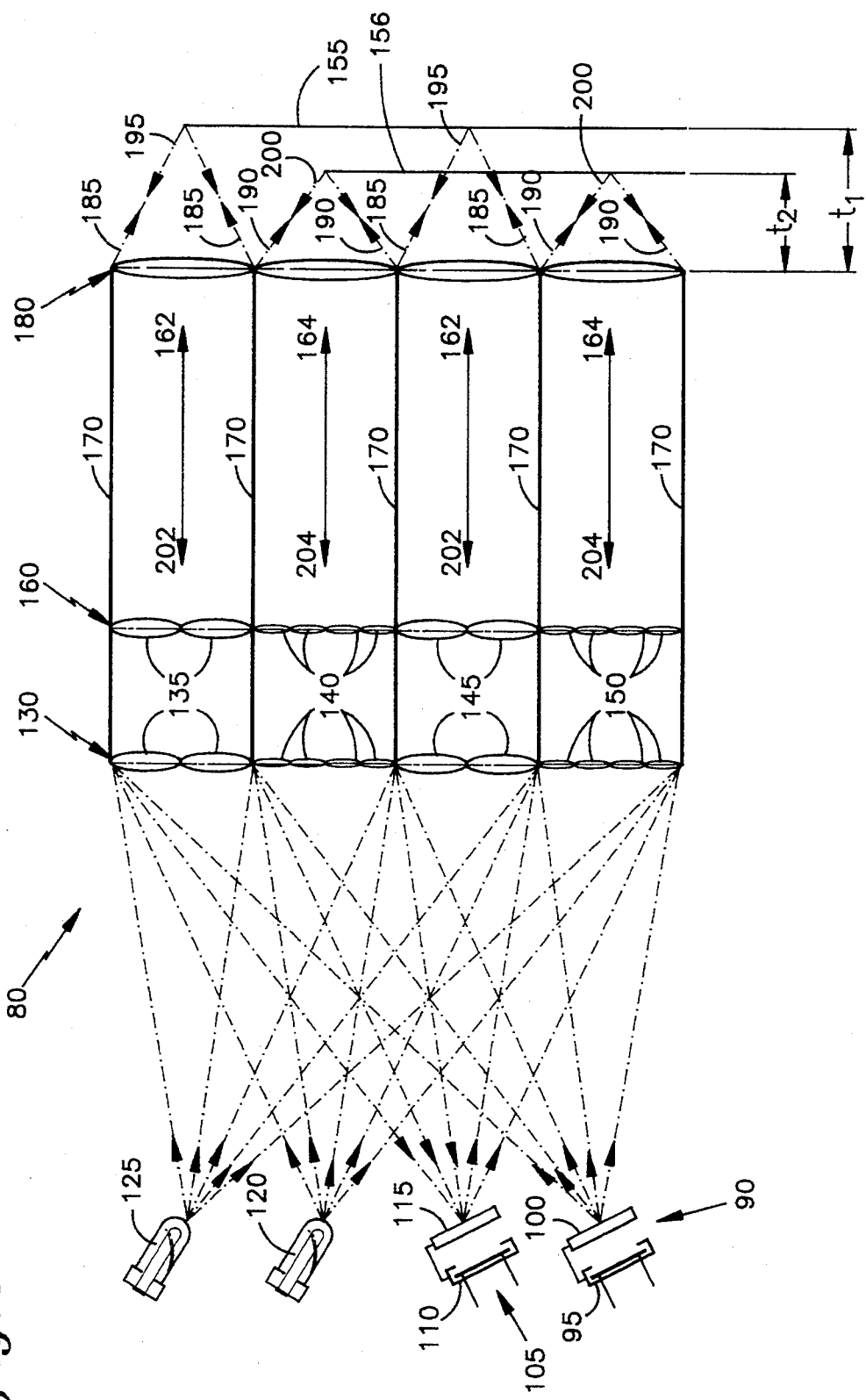
FIG. 3 illustrates a further embodiment of the present invention.

Referring to FIG. 3, a further embodiment of the present invention is depicted, showing a two dimensional self illuminating touch activated switch 80 in detail. To realize this 2-D switch 80, a first and a second light source 120 and 125 are employed. Both light source 120 and 125 preferably comprise light emitting diodes. Further, light sources 120 and 125 emit light in a first direction. The light emissions emanating from both light sources 120 and 125 are uniformly directed at a first lenslet 130, preferably comprising a MOM or MLM. A second lenslet 160 positioned in phase with first lenslet 130 is also incorporated.

Each light emission generated by light sources 120 and 125 respectively is individually collimated by both first and second lenslets, 130 and 160. As a result, a first collimated light emission 162 is created for the light generated by light source 120. Similarly, a second collimated light emission 164 is created for light generated by second light source 125.

The formation of both first and second collimated light emissions, 162 and 164, are the product of the configurations of both first and second lenslets, 130 and 160. To realize this aspect of the invention, lenslets 130 and 160 both comprise an array of lenses. Each array of lenses comprise two group of lens; a first having a first diameter and a second having a second diameter. These groups of lenses are arranged within each lenslet in an alternating pattern. Further, the group of lenses of each lenslet is in phase with the other lenslet's group of lenses. By this design, both lenses 135 having a first diameter are configured in both arrays adjacent to lenses 140 having a second diameter. This particular layout is further extended to both sets of lenses 145 and lenses 150. It should be noted that lenses 135 and 145 of both arrays each comprise two lens structures, in contrast to the four lens structures of lenses 140 and 150.

First and second lenslets 130 and 160, taken together, exhibit additional optical characteristics. When light in a second direction is directed at the lenslet combination, four focal points are formed. First light source 125 is positioned at the first focal point. In that same light, at the second focal point is positioned second light source 120. Further, a first and a second light detector assembly 105 and 90 is positioned at the third and fourth focal points, respectively.

Switch 80 further comprises a third lenslet 180. In one embodiment of the present invention, first, second and third lenslets are formed on a singular substrate. First and second collimated light emissions, 162 and 164, traveling in the first direction, illuminate third lenslet 180. Third lenslet 180 functionally converges first and second collimated light emissions 162 and 164 to two convergent light beams 185 and 190 at two pairs of sense points at distances $t_1$ and $t_2$ respectively from third lenslet 180. First convergent beams 185 form a first pair of sense points realized by a first plane 155, while second convergent beams 190 form a second pair of sense points realized by a second plane 156. It should be noted that in a further embodiment of the present invention, first, second and third lenslets each comprise a HOE.

Both pair of sense points directly relate to enabling-/disabling switch 10. By positioning an object or finger 60 at a sense point along either plane 155 or 156, the state of switch 10 may be changed. As described herein, changing the state of the switch 10 relies on the principles of partial reflection and light intensity modulation.

As before, it should be apparent to one of ordinary skill in the art that an object or finger placed at a sense point along either plane 155 or 156 changes the state of the switch. This can be understood by the fact that upon touching a sense point of either plane 155 or 156, one of first or second convergent light beams 162 or 164 is scattered. This results in scattered light emissions 195 or 200. Given the configuration of third lenslet 180, these scattered light emissions 197 or 200, traveling in the previously referred to second direction, are recollimated to form either recollimated light emissions 202 or 204. The recollimated light emission is then transmitted in the second direction to first and second lenslets, 130 and 160.

As described hereinabove, first and second lenslets 130 and 160 produces four focal points when light is directed in the second direction. Thus, by positioning first and second detector assemblies 110 and 96 at the third and fourth focal points, a change of the state of switch 80 can be realized by the detection of the light generated as a result of one of the recollimated light emissions reaching either the third or fourth focal point.

First and second detector assemblies 110 and 95, as in the first embodiment each comprise a light detector and a filtering means. The light source preferably comprises a light emitting diode, and the light source detector preferably comprises a light emitting diode detector. Filtering means are incorporated for the purpose of reducing the false triggers of switch 80. The filtering means also increases the immunity of switch 80 to the effects of ambient light passing through the third lenslet 180. The filtering means can be realized by a notch filter which selectively enables a spectral band of energy emitted from the light source to be transmitted into the light detector. In the alternative, filtering means 35 may comprise a light source which emits light energy having confined wavelength range, or color. Furthermore, a sensitive detector is also employed having the identical confined wavelength range, or color, to discern scattered light from ambient light.

Switch 80 further comprises a means 170 for preventing crosstalk between first and second collimated light emissions, 162 and 164 and for preventing crosstalk between first and second recollimated light 202 and 204. Means 170 is preferably realized by an opaque inter-segment baffle.

The widths of the first and second segments in lens assembly 180 are chosen to be significantly smaller than the expected object of actuation, such as a finger. As a result, the object of actuation cannot be detected by a segment having a focal point in plane 155 without also being detected by a segment having a focal point in plane 156. Because the object of detection will be detected in sequence first as it traverses plane 155 toward the surface 180, and then as it traverses plane 156, the sequence of signals from detectors 110 and 95 can be employed to discriminate false actuations from the desired detection targets.

While the second embodiment herein describes a two dimensional switch, it should be apparent to one of ordinary skill in the art that a switch having three or more dimensions can also be realized utilizing these principles. The design of such a multiple dimensional switch need follow the association of elements detailed hereinabove. For example, in a four dimensional switch, four light sources and four light detectors are required. In that same light, the number of groups of lenses within each lenslet would be four, each of the four having a different diameter.

By extension of the operation of the two-plane switch to more than two dimensions, the switch can be used to not only sense the presence of the object of actuation, but also its distance from the surface 180. As such, the switch can be also be employed as a proximity detector. Simple binning of the state of detection of detectors 110 and 95 will yield location information to within a separation of two planes—for example, the object of actuation may be determined to be located between planes 155 and 156. In this same example, by analyzing the relative strengths of the signals from detectors 110 and 95, using equation 1, a formula for estimating the position between planes 155 and 156 can be derived. This can be mathematically deduced by applying the inverse of equation 1 and solving for z'.

By using a numerical tabulation of equation 1 and an electronically stored look-up table, the location of the object of actuation may be precisely obtained. This can be realized by first localizing the object between two sensing planes, and then interpolating the signals from the relevant detectors using equation 1. A variety of approaches are known to those skilled in the art to arrive at this realization.

While the particular invention has been described with reference to illustrative embodiments, this description is not meant to be construed in a limiting sense. It is understood that although the present invention has been described in a preferred embodiment, various modifications of the illustrative embodiments, as well as additional embodiments of the invention, will be apparent to persons skilled in the art upon reference to this description without departing from the spirit of the invention, as recited in the claims appended hereto. Thus, the two dimensional switch of present invention can be employed into multiple throw switches, as well as an acknowledgment switch for status indication where operator feedback is necessary. Further, the switch can be employed in a scheme for detecting the position of an object. It is therefore contemplated that the appended claims will cover any such modifications or embodiments as fall within the true scope of the invention.

All of the U.S. Patents cited herein are hereby incorporated by reference as if set forth in their entirety.

What is claimed is:

1. A self illuminating switch activated by touching a surface comprising:
    a light source for generating a light ray;
    a first lens for collimating said light ray to provide a collimated light ray in a first direction and for forming a first and a second focal point in a second direction, said light source being positioned at said first focal point;
    a second lens for converging said collimated light ray to a surface, said surface scattering said collimated light ray to provide a scattered light ray at said first lens when said surface is substantially touched; and
    a detector for detecting said scattered light ray, said detector being positioned at said second focal point, such that the switch is activated in response to touching said surface.

2. The switch of claim 1, wherein at least one of said first and second lenses comprises at least one of a microoptic multiplet lenslet and a first and a second monolithic lenslet module.

3. The switch of claim 1, wherein at least one of said first and second lenses are formed on a substrate.

4. The switch of claim 1: wherein said detector comprises a filtering means for reducing false triggers associated with the touching said surface and for reducing the effects of ambient light.

5. The switch of claim 4, wherein said filtering means comprises a notch filter for selectively enabling a spectral band of energy emitted from said light source to be transmitted into said detector.

6. The switch of claim 1, wherein said detector comprises a light emitting diode detector.

7. The switch of claim 1, wherein said light source comprises a light emitting diode.

8. The switch of claim 1, wherein said at least one of said first and second lenses comprises a Holographic Optical Element ("HOE").

9. A switch activated by the position of an object comprising:
    a first light source for generating a first light ray;
    second light source for generating a second light ray;
    a first lenslet comprising:
        a first lens group for collimating said first light ray to provide a first collimated light ray in a first direction, and for forming a first and a second focal point in a second direction, each lens of said first lens group having a first diameter, said first light source being positioned at said first focal point; and
        a second lens group for collimating said second light ray to provide a second collimated light ray in said first direction, and for forming a third and a fourth focal point in said second direction, each lens of said second lens group having a second diameter, said second light source being positioned at said second focal point;
    a second lenslet comprising:
        a third lens group for converging said first collimated light ray to a first sense point, wherein said first collimated light ray is substantially scattered to provide a first scattered recollimated light ray when the object is positioned at said first sense point; and
        a fourth lens group for converging said second collimated light ray to a second sense point, wherein said second collimated light ray is substantially scattered to provide a second scattered recollimated light ray when the object is positioned at said second sense point;
    a first detector for detecting said first scattered recollimated light ray, said first detector being positioned at said third focal point; and
    a second detector for detecting said second scattered recollimated light ray, said second detector being positioned at said fourth focal point, such that the switch is activated in response to detecting at least one of said first and second scattered recollimated light rays.

10. The switch of claim 9, wherein at least one of said first and said second lenslets comprises an integrated monolithic lenslet module.

11. The switch of claim 9, wherein at least one of said first and second lenslets is formed on a substrate.

12. The switch of claim 9, further comprising:
    means for preventing crosstalk between said collimated first light ray and said collimated second light ray, and between said scattered recollimated first light ray and said second scattered recollimated light ray.

13. The switch of claim 12, wherein said means for preventing crosstalk comprises an opaque inter-segment baffle.

14. The switch of claim 9, wherein said detector comprises a filtering means for reducing false triggers associated with positioning the object and for reducing the effects of ambient light.

15. The switch of claim 14, wherein said filtering means comprises a notch filter for selectively enabling a spectral band of energy emitted from said light source to be transmitted into said detector.

16. The switch of claim 9, wherein said at least one of said first and second detectors comprises a light emitting diode detector and at least one of said first and second light sources comprises a light emitting diode.

17. The switch of claim 9, wherein said at least one of said first and second lenslets comprises a Holographic Optical Element ("HOE").

18. A switch activated by the position of an object comprising:
   a plurality of light sources for generating a plurality of light rays;
   a first lenslet comprising a plurality of primary lenses, each lens of said plurality of primary lenses collimating a light ray of said plurality of light rays such that a plurality of collimated light rays are provided in a first direction, each lens of said primary lenses forming a plurality of pairs of focal points for each lens of said plurality of primary lenses in a second direction, each light source of said plurality of light sources being positioned at a first focal point of said plurality of pairs of focal points, each lens of said plurality of primary lenses having a diameter;
   a second lenslet comprising a plurality of secondary lenses, each lens of said plurality of secondary lenses converging one collimated light ray of said plurality of collimated light rays to a sense point such that a plurality of sense points are created, wherein a scattered light ray is formed for each lens of said plurality of secondary lenses when the object is positioned at one sense point associated with said each lens of said plurality of secondary lenses, each lens of said plurality of secondary lenses having a diameter; and
   a plurality of detectors for detecting scattered light rays, each of said plurality of detectors being positioned at one of said plurality of second focal points, such that the switch is activated in response to detecting said scattered light ray.

19. The switch of claim 18, wherein at least one of said first and said second lenslets comprises an integrated monolithic lenslet module.

20. The switch of claim 18, wherein at least one of said first and second lenslets is formed on a substrate.

21. The switch of claim 18, further comprising:
   means for preventing crosstalk between said collimated first light ray and said collimated second light ray, and between said scattered first light ray and said second scattered light ray, said means for preventing crosstalk comprises an opaque intersegment baffle.

22. The switch of claim 18, wherein said detector comprises a filtering means for reducing false triggers associated with positioning the object and for reducing the effects of ambient light, said filtering means comprises a notch filter for selectively enabling a spectral band of energy emitted from said light source to be transmitted into said detector.

23. The switch of claim 18, wherein at least one of said first and second lenslets comprises a Holographic Optical Element ("HOE").

* * * * *